(12) United States Patent
Mahajan et al.

(10) Patent No.: US 10,573,526 B2
(45) Date of Patent: Feb. 25, 2020

(54) METHOD OF CHARGE CONTROLLED PATTERNING DURING REACTIVE ION ETCHING

(71) Applicant: International Business Machines Corporation, Armonk, NY (US)

(72) Inventors: Sunit S. Mahajan, Clifton Park, NY (US); Bachir Dirahoui, Bedford Hills, NY (US); Richard Wise, Los Gatos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 430 days.

(21) Appl. No.: 15/266,121

(22) Filed: Sep. 15, 2016

(65) Prior Publication Data

US 2017/0076951 A1    Mar. 16, 2017

Related U.S. Application Data

(63) Continuation of application No. 14/850,491, filed on Sep. 10, 2015, now Pat. No. 9,496,148.

(51) Int. Cl.
*H01J 37/00* (2006.01)
*H01L 21/3065* (2006.01)
(Continued)

(52) U.S. Cl.
CPC .... *H01L 21/3065* (2013.01); *H01J 37/32009* (2013.01); *H01J 37/32532* (2013.01);
(Continued)

(58) Field of Classification Search
CPC .. H01L 21/3065; H01L 21/6833; H01J 37/00; H01J 37/32009; H01J 37/32532
See application file for complete search history.

(56) References Cited

U.S. PATENT DOCUMENTS 4,426,274 A * 1/1984 Ephrath .................. C23F 4/00
                                                        204/192.32
4,475,982 A   10/1984 Lai
(Continued)

FOREIGN PATENT DOCUMENTS

JP         2006245510 A      9/2006

OTHER PUBLICATIONS

List of IBM Patents or Patent Applictions Treated as Related; (Appendix P), Filed Sep. 16, 2016, 2 pages.

(Continued)

*Primary Examiner* — Robert M Kunemund
(74) *Attorney, Agent, or Firm* — Cantor Colburn LLP; Alvin Borromeo

(57) ABSTRACT

A plasma processing apparatus for reactive ion etching a wafer includes a wafer chuck within a chamber and an electrode for creating a plasma within the chamber above the wafer chuck. There is provided on the wafer chuck a semiconductor wafer having a p− layer and an n+ layer. Both p− and n+ layers have exposed peripheral edges. Also provided is an anode comprising the plasma, a cathode comprising the wafer chuck, and a gate comprising the peripheral edge of the n+ layer. A coating layer is formed on a portion of the peripheral edge of the n+ layer. The coating layer reduces charge flow to a portion of the semiconductor wafer below the coating layer.

20 Claims, 5 Drawing Sheets

(51) Int. Cl.
*H01J 37/32* (2006.01)
*H01L 21/683* (2006.01)
*H01L 21/768* (2006.01)
*H01L 29/66* (2006.01)

(52) U.S. Cl.
CPC .... *H01L 21/6833* (2013.01); *H01L 21/76898* (2013.01); *H01L 29/66363* (2013.01); *H01J 2237/334* (2013.01)

(56) References Cited

U.S. PATENT DOCUMENTS

| | | | |
|---|---|---|---|
| 5,869,402 A * | 2/1999 | Harafuji | H05H 1/00 118/723 E |
| 6,051,100 A | 4/2000 | Walko, II | |
| 6,190,518 B1 | 2/2001 | Phan et al. | |
| 6,468,915 B1 * | 10/2002 | Liu | H01L 21/02164 257/E21.029 |
| 6,620,736 B2 | 9/2003 | Drewery | |
| 6,812,145 B2 | 11/2004 | Ma | |
| 7,105,451 B2 | 9/2006 | Kishiro | |
| 7,273,638 B2 | 9/2007 | Belyansky et al. | |
| 7,470,625 B2 | 12/2008 | Li et al. | |
| 8,343,878 B2 | 1/2013 | Qiu et al. | |
| 8,460,569 B2 | 6/2013 | Gode et al. | |
| 8,562,750 B2 | 10/2013 | Chen et al. | |
| 9,230,819 B2 | 1/2016 | Paterson et al. | |
| 2004/0112544 A1 | 6/2004 | Yan et al. | |
| 2007/0224829 A1 * | 9/2007 | Ji | H01L 21/31116 438/710 |
| 2008/0050871 A1 | 2/2008 | Stocks | |
| 2013/0020642 A1 | 1/2013 | Basker et al. | |

OTHER PUBLICATIONS

Mahajan, Sunit S., et al., "Method of Charge Controlled Patterning During Reactive Ion Etching," U.S. Appl. No. 14/850,491, filed Sep. 10, 2015.

Improving Front Side Process Uniformity by Back-Side Metallization; Kezia Cheng; Skyworks Solutions, Inc.; CS Mantech Conference, Apr. 23-26, 201, Boston, MA, USA.

Technique for Eliminating Notching in Through-wafer Etching; Sunil Kumar et al; Optical and Semiconductor Devices Group, Electrical and Electronics Engineering, Imperical collge; 16th MME Micromechanics Europe Workshop, Goteborg, Sweden; pp. 88-91(2005).

* cited by examiner

METHOD OF CHARGE CONTROLLED PATTERNING DURING REACTIVE ION ETCHING

DOMESTIC PRIORITY

This application is a continuation of U.S. patent application Ser. No. 14/850,491, filed Sep. 10, 2015, the contents of which are incorporated by reference it its entirety.

BACKGROUND

The present invention relates to plasma etching of semiconductive materials, and more specifically to controlling charge flow vertically through the semiconductor wafer layers during reactive ion etching.

During reactive ion etching, variations in etch depth and profile can occur across the wafer surface for the same desired feature. It would be advantageous to minimize such variations to better control dimensions for features such as vias and trenches.

SUMMARY

Bearing in mind the problems and deficiencies of the prior art, it is therefore an object of the present invention to provide a method of reactive ion etching which reduces variations in etch depth and profile across the wafer surface for the same desired feature.

It is another object of the present invention to provide a method of reactive ion etching which controls etch depth and profile near the wafer edge.

A further object of the invention is to control etch depth and profile during reactive ion etching of wafers which have alternating n and p-type layers.

It is yet another object of the present invention to provide a method of controlling charge flow vertically through the semiconductor wafer layers during reactive ion etching.

Still other objects and advantages of the invention will in part be obvious and will in part be apparent from the specification.

The above and other objects, which will be apparent to those skilled in the art, are achieved in the present invention which is directed to a method of reactive ion etching a wafer comprising providing a plasma processing tool having a wafer chuck within a chamber and an electrode for creating a plasma within the chamber above the wafer chuck. The method also includes providing on the wafer chuck a semiconductor wafer having a p− layer and an n+ layer. Both p− and n+ layers have exposed peripheral edges during plasma etching to electrically form with the plasma processing tool during plasma etching a diode having an anode comprising the plasma, a cathode comprising the wafer chuck and a gate comprising the n+ layer peripheral edge. The method further includes controlling charge flow during plasma etching adjacent the peripheral edge of the n+ layer to reduce charge transport into, within and out of the semiconductor wafer adjacent the n+ layer peripheral edge, and reactive ion etching the n+ layer while controlling the charge flow along the peripheral edge of the n+ layer.

In a related aspect the present invention is directed to a method of reactive ion etching a wafer comprising providing a plasma processing tool having a wafer chuck within a chamber and an electrode for creating a plasma within the chamber above the wafer chuck and providing on the wafer chuck a semiconductor wafer having a p− layer and, above the p− layer, a n+ layer to be etched. The n+ layer has a peripheral edge, and the p− layer has during plasma etching an exposed peripheral edge. As a result, the semiconductor wafer electrically forms with the plasma processing tool during plasma etching an anode comprising the plasma, a cathode comprising the wafer chuck and a gate comprising the n+ layer peripheral edge. The method further includes controlling charge flow during plasma etching adjacent the peripheral edge of the n+ layer to reduce charge transport into, within and out of the semiconductor wafer adjacent the n+ layer peripheral edge, and reactive ion etching the n+ layer while controlling the charge flow along the peripheral edge of the n+ layer.

During reactive ion etching the plasma processing tool can electrically form a diode with the semiconductor wafer.

The reactive ion etching can create vias or trenches in the n+ layer.

The charge flow during plasma etching can be controlled by applying adjacent the peripheral edge of the n+ layer a coating layer of a material that reduces charge flow to the portion of the semiconductor wafer below the material, while leaving a major portion of the n+ layer surface free of the material during the reactive ion etching. The material can be an electrical non-conductor, a polymer or a resist.

The n+ layer can have a bevel between the n+ layer surface and the n+ layer peripheral edge, and the coating layer can extend along the n+ layer bevel. The coating layer can extend along the n+ layer peripheral edge, and/or can extend along a portion of the n+ layer surface adjacent the n+ layer peripheral edge. The coating layer can extend along a portion of a peripheral edge of the semiconductor wafer in contact with the wafer chuck.

The charge flow during plasma etching can be controlled by doping the n+ layer adjacent the n+ layer peripheral edge with an implant of an n or p type dopant that reduces charge flow to the portion of the semiconductor wafer adjacent the n+ layer peripheral edge, while leaving a major portion of the n+ layer surface free of the dopant during the reactive ion etching.

The charge flow during plasma etching can be controlled by providing variation in electrical conductivity between the p− layer and the wafer chuck adjacent the exposed edge of the p− layer as compared to a remaining central region of the p− layer above the wafer chuck to reduce charge flow to the portion of the semiconductor wafer adjacent the n+ layer peripheral edge. The variation in electrical conductivity between the p− layer and the wafer chuck adjacent the exposed edge of the p− layer can be provided by reducing conductivity of the wafer chuck below the exposed edge of the p− layer as compared to conductivity of the wafer chuck below the remaining region of the p− layer. The variation in electrical conductivity between the p− layer and the wafer chuck adjacent the exposed edge of the p− layer can be provided by reducing contact of the wafer chuck with the semiconductor wafer below the exposed edge of the p− layer as compared to contact of the wafer chuck below the remaining region of the p− layer.

The charge flow during plasma etching can be controlled by applying radiation selected from the group consisting of heat and electromagnetic radiation to reduce charge from adjacent the peripheral edge of the n+ layer, as compared to a remaining portion of the semiconductor wafer, during the reactive ion etching.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, can best be understood by reference to the detailed description which follows taken in conjunction with the accompanying drawings in which:

DETAILED DESCRIPTION

In describing the embodiment of the present invention, reference will be made herein to FIGS. 1-11 of the drawings in which like numerals refer to like features of the invention.

Figure 1:
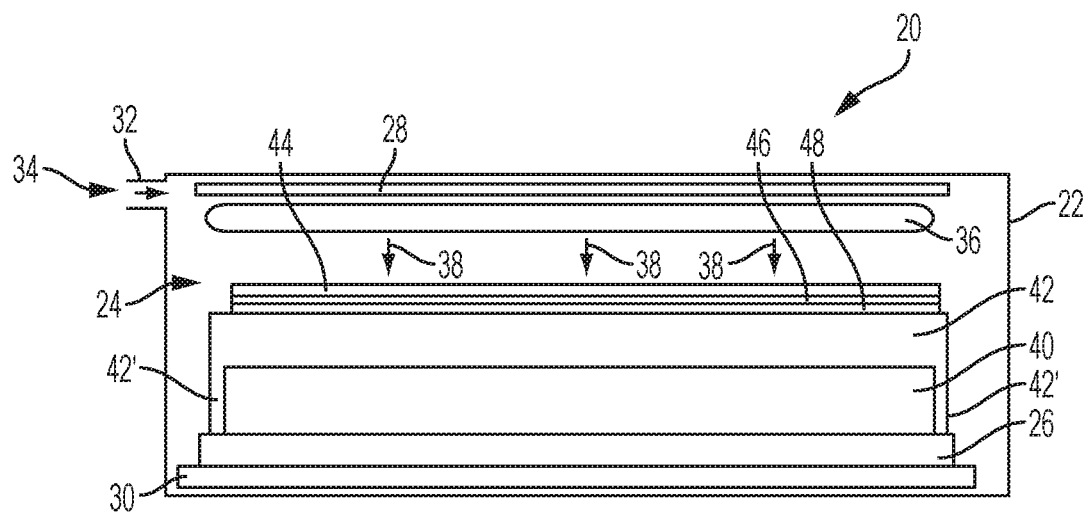
FIG. 1 is a side cross sectional view of a wafer in a plasma processing tool for reactive ion etching in accordance with the present invention.

A plasma processing tool 20 is depicted in FIG. 1 having a housing 22 and within the housing, a vacuum chamber 24 having a wafer platen or chuck 26 for receiving the circular wafer to be etched by reactive ion etching. A lower electrode 39 is isolated from the chamber walls and electrically connected to chuck 26, and an upper electrode 28 is electrically connected to the chamber walls and spaced a distance above the chuck 26. A gas 34 such as sulfur hexafluoride ($SF_4$) which is reactive with silicon enters through gas inlet 32 and exits though the vacuum pump (not shown) for chamber 24.

The wafer that can be etched by the method of the present invention has alternating p and n-type semiconductor layers. The n-type semiconductor layer has a larger electron concentration than hole concentration, and can be doped, for example, with phosphorus. The p-type semiconductor layer has a larger hole concentration than electron concentration, and can be doped, for example, with boron. The wafer to be etched in the example shown consists of a p− layer of <100> orientation silicon substrate 40 in contact with chuck 26 and, directly above layer 40, a n+ layer of epitaxial silicon 42 with an upper surface to be etched. Initially, a thin layer of the n+ layer 42' can surround the side edges of p− layer 40, and can even extend under it (not shown), between the p− layer and the chuck. Above n+ layer 42 is undoped silicon SOI layer 46, and between layers 42 and 46, isolating silicon oxide BOX layer 48. A photoresist layer 44 is deposited over the surface of layer 46 and contains openings created there through (by normal lithographic methods) which are configured to the pattern to be etched in layer 42. Other layers can be present between BOX layer 48 and resist layer 44.

Figure 2:
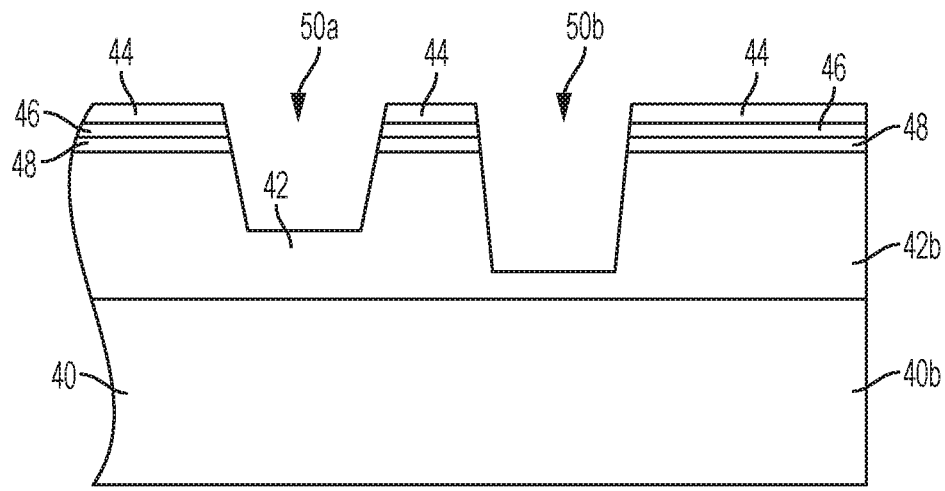
FIG. 2 is a side cross sectional view of a portion of the wafer of FIG. 1 showing vias or trenches etched by reactive ion etching.

During reactive ion etching a radio frequency (RF) electric field is created between electrodes 28 and 30, which creates a plasma 36 of the reactive gas above the wafer. During the process the plasma builds up a positive charge and the wafer electrically connected to the chuck and builds up a negative charge, and the result is that the positive ions of the reactive gas 34 etch the exposed portions of the layer 42 beneath resist layer 44. As shown in FIG. 2, after reactive ion etching the result is trenches or vias 50a, 50b etched to a desired depth in layer 42 through openings beneath those originally in resist layer 44. Also, during the reactive ion etching the layer of the n+ layer 42' along the side edges of p− layer 40 erodes, exposing peripheral p− layer edge 40b below and adjacent to peripheral n+ layer edge 42b.

Figure 3:
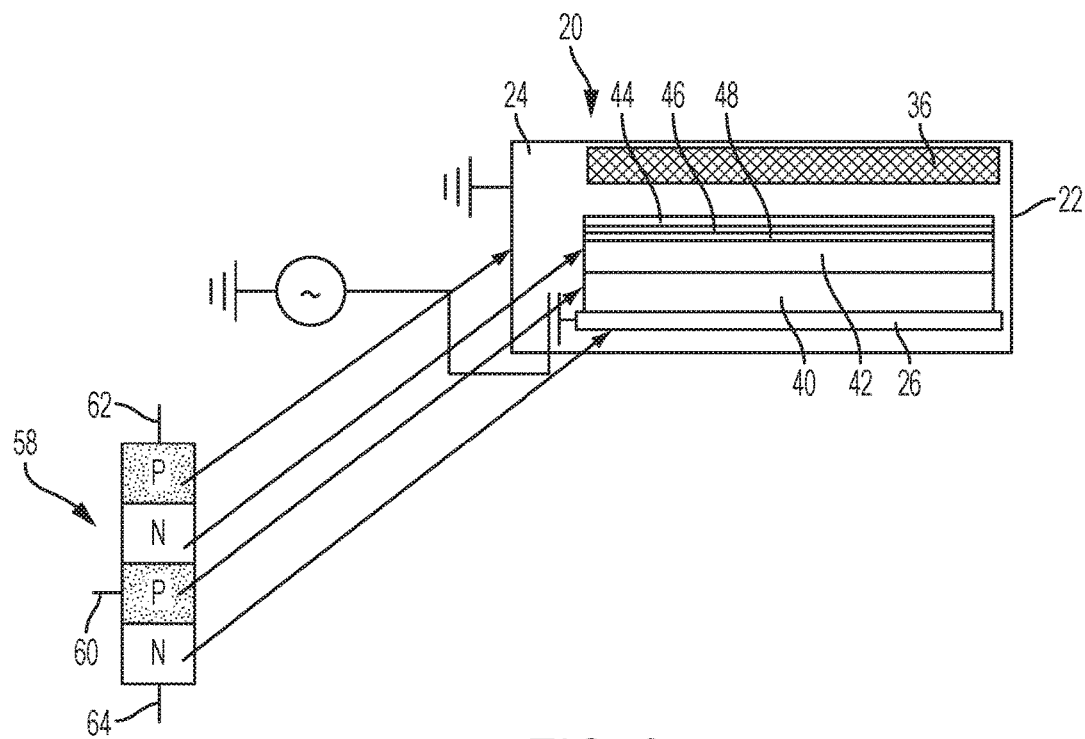
FIG. 3 is a side cross sectional view of a wafer and plasma processing tool of FIG. 1 showing the electrical circuit equivalent to that of a thyristor.
Figures 4, 5:
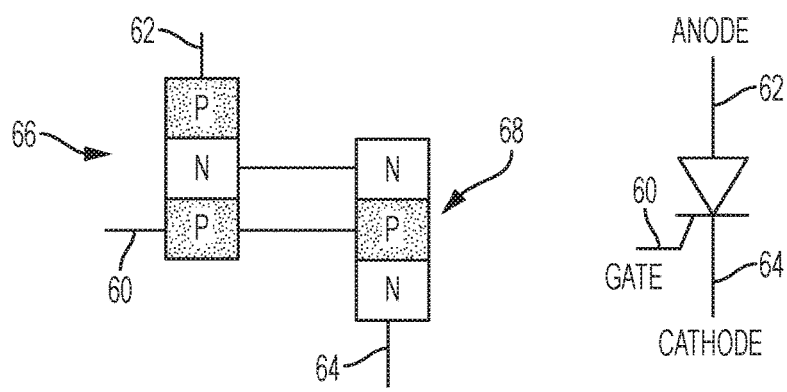
FIG. 4 is a schematic view of alternating n and p-type layers of a pair of coupled bipolar junction transistors forming a thyristor.
FIG. 5 is a schematic depiction of a thyristor.

For the type of wafer to be reactive ion etched as shown in FIGS. 1 and 2, the sequence of doped wafer layers in combination with the plasma and chuck potentials of the plasma tool forms a circuit of a thyristor once the p− layer edge 40b is exposed. As seen in FIG. 3 with the edge of p− layer 40 exposed, the n+ epitaxial/p-junction of layers 42 and 40, respectively, form one part of the thyristor 58. The chamber wall and +anode 28 form a p-electrode and the DC-isolated wafer chuck 26 form an n-type due to negative self-bias. A thyristor has four layers of alternating n and p-type material, and is structurally equivalent to a pair of bipolar junction transistors 66, 68 coupled as shown in FIG. 4. The thyristor 58 formed by this structure electrically has an anode 62, a cathode 64 and a gate 60 at the intermediate p-type material (e.g., layer 40), and is typically depicted as shown in FIG. 5.

Figure 6:
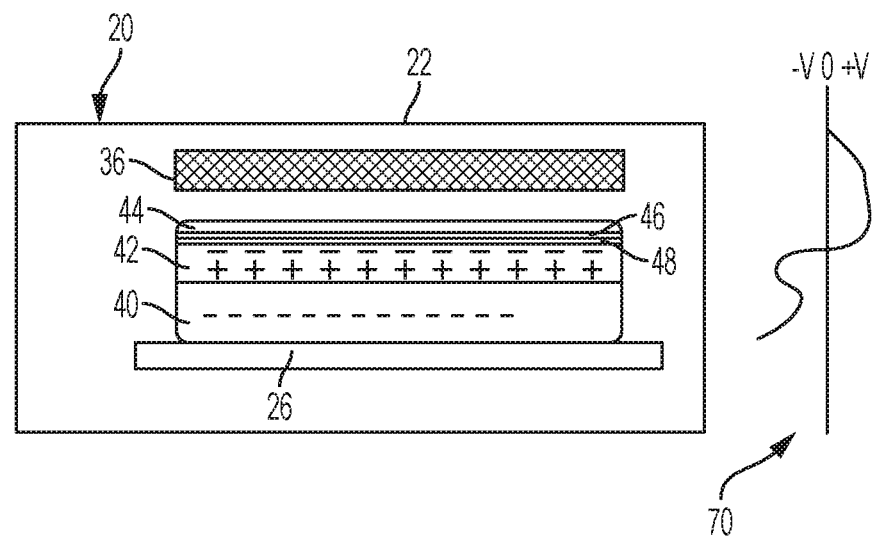
FIG. 6 is a side cross sectional view of a wafer and plasma processing tool of FIG. 1 showing the plasma potential as it varies vertically through the chamber and wafer of FIG. 1.

The DC electrical potentials of the wafer and plasma tool structure are shown in FIG. 6. The plasma potential, for positive charges, is shown on the scale 70 at the right as it varies vertically through the chamber and wafer. It has been found that because of this electrical arrangement in reactive ion etching (RIE), the electrodynamics during trench etching causes certain effects. In particular, there is a charge accumulation at the N+ side of depletion region as the electric field tends to accelerate holes toward the chuck. The RIE ions deposit positive charge on the wafer surfaces, so that the +(holes) flow toward back, discharge by the RF. The top and side of the substrate accumulates electrons, i.e., attracts ions. The electron pile-up produces a corona discharge, leading to edge erosion. The + ion impact at the sides of the wafer turns on thyristor via the p-gate 60. The thyristor current removes the positive charge from free surfaces. At steady-state, the incoming ion flux equals the net thyristor current, and decreases halt flow.

Figure 7:
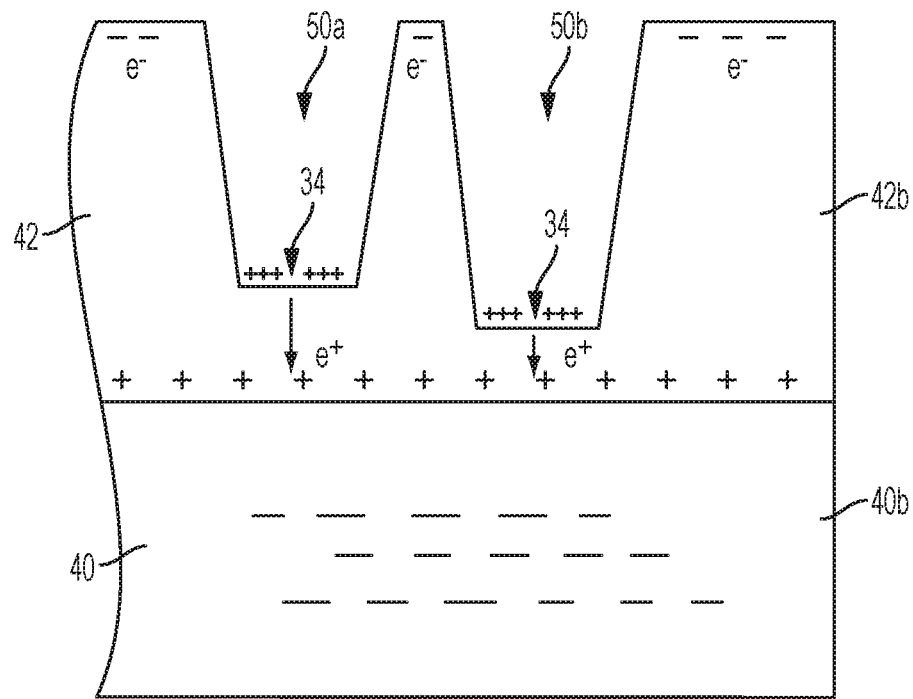
FIG. 7 is a side cross sectional view of the wafer vias or trenches of FIG. 2 with charge accumulations near the peripheral side edge of the wafer.
Figure 8:
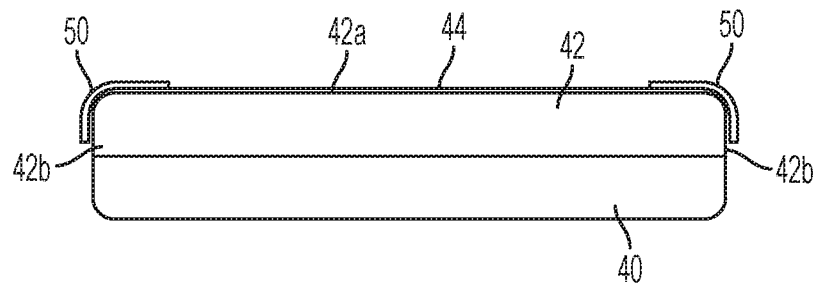
FIG. 8 is a side cross sectional view of a wafer showing one method of controlling vertical charge flow by coating the wafer edges.

As shown more particularly in FIG. 7 depicting the physical etch near peripheral side edges 42b and 40b of layers 42 and 40, respectively, electrons (e−) are highly isotropic, and are trapped at the upper entrance to vias or trenches 50a, 50b. Although vias or trenches 50a, 50b have high aspect ratios, the ion flux is anisotropic and reaches the bottom of the vias or trenches. The removal of positive charge from reactive gas 34 drives the silicon etch by electrophilic species such as $CF_4/SF_6$. However, the + hole accumulation at n+/p-interface between layers 42 and 40, respectively, slows current flow through the thickness of the wafer. This depletion field accelerates current forward biased junction when gated or activated. Uneven charge flow across the wafer can result in uneven depth or other dimension to features etched into the surface of the wafer during reactive ion etching (RIE), depending on the distance from the wafer edge.

Accordingly, in accordance with the present invention, charge transport into, within and out of the wafer during RIE can be controlled to avoid these detrimental changes in current flow.

A first method of controlling charge flow in wafer structures of the type shown herein, and generally when reactive ion etching an n+ layer disposed over a p− layer, is by patterning or depositing material on the wafer edge, top and/or bottom surface. This is shown by way of example in FIG. 8, where in the wafer the n+ layer 42 above p− substrate 40 has upper surface 40*a* and peripheral edges 42*b* along its side. A dielectric or non-electrically conducting coating 50 can be applied along a portion of the peripheral edge 42*b* extending downward from the top surface, and to a portion of the top surface 42*a* extending radially inward from the peripheral edge. This coating layer 50 can extend over edge portions of resist layer 44, and can be a polymer to protect against corona discharge. The coating 50 can also be a photoresist material, which can be separate and apart from the photoresist layer 44 used to pattern the etch features.

Figure 9:
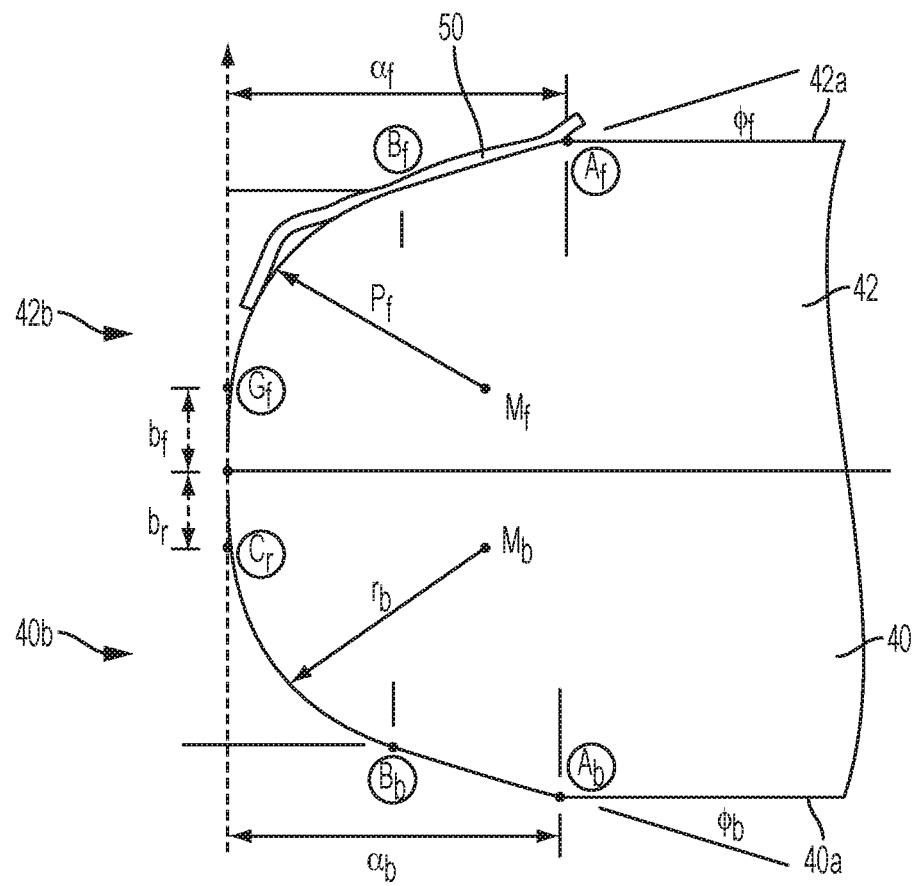
FIG. 9 is a more detailed side cross sectional view of an example of a wafer edge coating to control vertical charge flow.

A further example of edge coating is shown in FIG. 9, where there is shown in more detail the bevels on the side peripheral edges 40*b* and 42*b* of layers 40 and 42, respectively. Upper layer 42 includes a vertical apex segment $b_f$ between the layer 40/42 interface and point $C_f$, a front shoulder segment having a radius $M_f$ between points $C_f$ and $B_f$, and a front bevel segment between points $B_f$ and $A_f$ having an angle of $\phi_f$ with the upper surface 42*a*. Lower layer 40 includes a vertical apex segment $b_b$ between the layer 40/42 interface and point $C_b$, a back shoulder segment having a radius $M_b$ between points $C_b$ and $B_b$, and a back bevel segment between points $B_b$ and $A_b$ having an angle of $\phi_b$ with the lower surface 40*a*. Coating layer 50 is applied substantially over the front shoulder and front bevel segments of layer 42. The wafer can not be fully encapsulated with uneven dielectric films, and the contact between the lower layer 40 and chuck 26 should be uniform.

Figure 10:
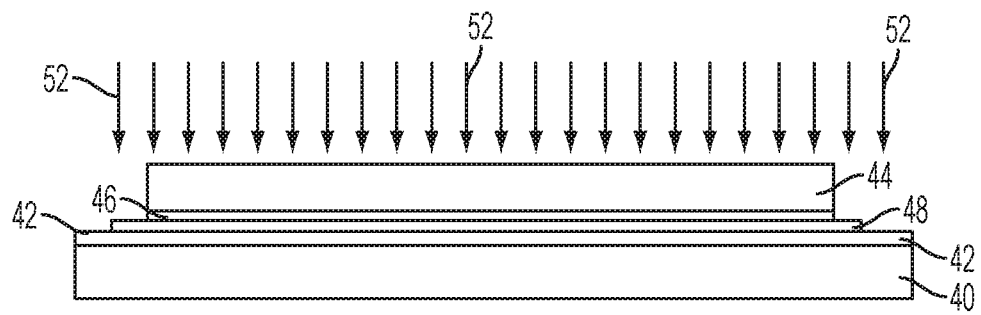
FIG. 10 is a side cross sectional view of a wafer showing another method of controlling vertical charge flow by implanting the wafer edges to reduce conductivity within the wafer.

Another method of controlling charge flow in wafer structures is shown in FIG. 10, wherein lateral complementary dopant areas are created on the wafer surface for control of charge flow and ion trajectory. In FIG. 10, the edge of the wafer is implanted or doped to make the silicon less conductive. Substrate p− layer 40 has n+ layer 42 above it. A resist coating layer 44 can be applied above the SOI 46 and BOX 48 layers on the wafer, and a high energy, deep implant 52 can be applied thereover to dope the edges of layers 42 and 40 outside of resist 44. This degree of edge doping can be adjusted as necessary to provide the desired lower conductivity along the peripheral edge of layers 42 and 40 to control charge flow during the RIE process, and consequently make the etch profiles near the wafer edges consistent with those near the center of the wafer.

Figure 11:
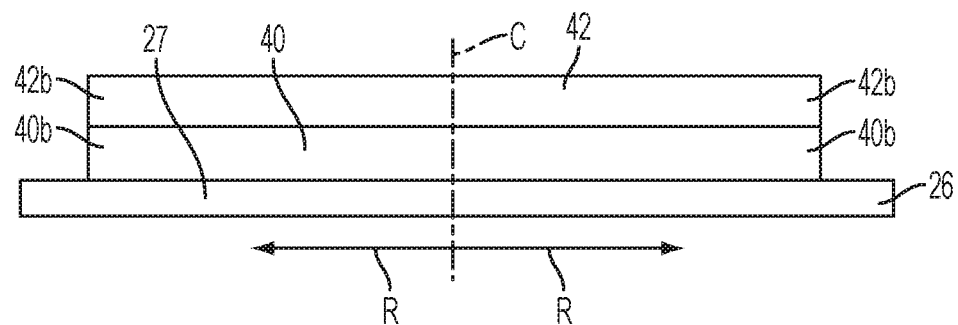
FIG. 11 is side cross sectional view of a wafer showing another method of controlling vertical charge flow by reducing current flow from the chuck to the wafer near the wafer edges.

FIG. 11 shows a further method of controlling charge flow in wafer structures, by deliberately introducing variations in chuck conductivity, wafer contact or grounding. In one embodiment, the electrical conductivity of the chuck is varied as a function of radial distance R from the center C of the wafer. The conductivity of chuck 26 is reduced near the wafer edges 40*b*, 42*b* compared to the wafer center. In another embodiment, the electrical contact at interface 27 between the chuck 26 and the lower substrate 40 is varied as a function of radial distance R from the center C of the wafer, so that the degree of contact is reduced, and the electrical resistance along the interface is increased, near the wafer edges 40*b*, 42*b* compared to the wafer center. This method directs and controls vertical current flow depending on the distance from the wafer edge, to reduce locally variation etch profiles or depths between the center of the wafer and the edges of the wafer.

The method of the present invention therefore intentionally uses one or more of neighboring diode-like junctions within a semiconductor substrate, as described above, for the purpose of controlling patterning during subsequent reactive ion etch.

Accordingly, the present invention provides a solution to one or more of the objects above. Use of the method of the invention can allow for superior design and construction of switchgear, filamentary emitters and trench arrays by ensuring critical dimension uniformity and nanoscale control of electrical discharges during reactive ion etching.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, and/or components, but do not preclude the presence or addition of one or more other features, integers, steps, operations, elements, components, and/or groups thereof.

The corresponding structures, materials, acts, and equivalents of all elements or steps in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. It is therefore contemplated that the appended claims will embrace any such alternatives, modifications and variations as falling within the true scope and spirit of the present invention.

What is claimed is:

1. A plasma processing system comprising:
    a plasma processing apparatus comprising:
        a wafer chuck within a chamber;
        an electrode for creating a plasma within the chamber above the wafer chuck;
        an anode comprising the plasma; and
        a cathode comprising the wafer chuck;
    a semiconductor wafer between the wafer chuck and the electrode, the semiconductor wafer having a p− layer and, above the p− layer, a n+ layer, the p− layer and the n+ layer each having a peripheral edge;
    a gate comprising the peripheral edge of the n+ layer; and
    a coating layer on a portion of the peripheral edge of the n+ layer;
    wherein the coating layer reduces charge flow to a portion of the semiconductor wafer below the coating layer.

2. The system of claim 1, further comprising a major portion of the n+ layer free of the coating layer.

3. The system of claim 1, wherein the coating layer is an electrical non-conductor.

4. The system of claim 3, wherein the coating layer is a polymer.

5. The system of claim 1, wherein the coating layer is a resist.

6. The system of claim 1, further comprising a bevel between a surface of the n+ layer and the n+ layer peripheral edge, and wherein the coating layer extends along the bevel.

7. The system of claim 6, wherein the coating layer extends along a portion of the surface of the n+ layer adjacent to the n+ layer peripheral edge.

8. The system of claim 6, wherein the coating layer extends along a portion of a peripheral edge of the semiconductor wafer in contact with the wafer chuck.

9. A plasma processing system comprising:
a plasma processing apparatus comprising:
a wafer chuck within a chamber;
an electrode for creating a plasma within the chamber above the wafer chuck;
an anode comprising the plasma; and
a cathode comprising the wafer chuck;
a semiconductor wafer between the wafer chuck and the electrode, the semiconductor wafer having a p– layer and, above the p– layer, a n+ layer, the p– layer and the n+ layer each having a peripheral edge;
a gate comprising the peripheral edge of the n+ layer; and
a dopant formed in a portion of the peripheral edge of the n+ layer;
wherein the dopant reduces charge flow to a portion of the semiconductor wafer adjacent to the portion of the peripheral edge of the n+ layer.

10. The system of claim 9, wherein a major portion of the n+ layer is free of the dopant.

11. The system of claim 9, wherein the dopant is an n-type dopant.

12. The system of claim 9, wherein the dopant is a p-type dopant.

13. The system of claim 9, wherein the dopant is implanted along a portion of a surface of the n+ layer adjacent to the n+ layer peripheral edge.

14. The system of claim 9, wherein the dopant is implanted along a portion of a peripheral edge of the semiconductor wafer in contact with the wafer chuck.

15. The system of claim 9, further comprising a bevel between a surface of the n+ layer and the n+ layer peripheral edge, and wherein the dopant is formed in the bevel.

16. A plasma processing system comprising:
a plasma processing apparatus comprising:
a wafer chuck within a chamber;
an electrode for creating a plasma within the chamber above the wafer chuck;
an anode comprising the plasma; and
a cathode comprising the wafer chuck;
a semiconductor wafer between the wafer chuck and the electrode, the semiconductor wafer having a p– layer and, above the p– layer, a n+ layer, the p– layer and the n+ layer each having a peripheral edge;
a gate comprising the peripheral edge of the n+ layer; and
a dopant formed in a portion of the peripheral edge of the n+ layer;
wherein a conductivity between the p– layer and the wafer chuck varies as a function of a radial distance from a center of the wafer chuck to reduce charge flow to a portion of the semiconductor wafer adjacent to the n+ layer peripheral edge.

17. The system of claim 16, wherein the conductivity of the wafer chuck varies as a function of the radial distance from the center of the wafer chuck.

18. The system of claim 17, wherein the conductivity increases towards the center and decreases towards an edge of the wafer chuck.

19. The system of claim 17, wherein the conductivity of a portion of the wafer chuck adjacent to a peripheral edge of the semiconductor wafer is less than the conductivity of a second portion of the wafer chuck.

20. The system of claim 16, wherein a degree of electrical contact between the wafer chuck and the semiconductor wafer varies as a function of the radial distance from the center of the wafer chuck.

* * * * *